United States Patent

Moga

(10) Patent No.: US 9,581,635 B2
(45) Date of Patent: Feb. 28, 2017

(54) SYSTEM AND METHOD FOR HIGH VOLTAGE CABLE DETECTION IN HYBRID VEHICLES

(71) Applicant: Allison Transmission, Inc., Indianapolis, IN (US)

(72) Inventor: Viorel N. Moga, Carmel, IN (US)

(73) Assignee: Allison Transmission, Inc., Indianapolis, IN (US)

( * ) Notice: Subject to any disclaimer, the term of this patent is extended or adjusted under 35 U.S.C. 154(b) by 461 days.

(21) Appl. No.: 14/323,103

(22) Filed: Jul. 3, 2014

(65) Prior Publication Data

US 2014/0312685 A1    Oct. 23, 2014

Related U.S. Application Data

(63) Continuation of application No. PCT/US2013/021111, filed on Jan. 11, 2013.

(Continued)

(51) Int. Cl.
*B60L 3/00* (2006.01)
*B60R 16/033* (2006.01)
(Continued)

(52) U.S. Cl.
CPC ........... *G01R 31/041* (2013.01); *B60L 3/0023* (2013.01); *B60R 16/033* (2013.01); *B60W 10/26* (2013.01);
(Continued)

(58) Field of Classification Search
CPC .... B60L 3/0023; B60L 3/0046; B60R 16/033; G01R 31/02; G01R 31/021; G01R 31/024; G01R 31/026; G01R 31/04; G01R 31/041; G01R 31/08
(Continued)

(56) References Cited

U.S. PATENT DOCUMENTS

| 4,634,955 A | 1/1987 | Wada |
| 5,592,093 A | 1/1997 | Klingbiel |

(Continued)

FOREIGN PATENT DOCUMENTS

| CN | 1080058 A | 12/1993 |
| CN | 101544215 | 9/2009 |

(Continued)

OTHER PUBLICATIONS

International Search Report and Written Opinion issued in PCT/US2013/021111, dated Jun. 24, 2013.

(Continued)

*Primary Examiner* — Levi Gannon
(74) *Attorney, Agent, or Firm* — Woodard, Emhardt, Moriarty, McNett & Henry LLP

(57) ABSTRACT

A system and method described herein detects the presence of an unconnected condition in high voltage component cables in an electric or hybrid-electric vehicle having a high voltage battery or energy storage system. The system includes a DC-DC converter which is capable of operating in either a step-down mode (e.g., as a buck converter) or a boost mode. The system uses the DC-DC converter operating in boost mode to create a sufficient, yet safe, measuring voltage on the main high voltage cabling of the vehicle before allowing the energy storage system to begin supplying high voltage power to the system components. The measurements are taken at various points near the individual components to determine if the cable has become disconnected.

20 Claims, 2 Drawing Sheets

Related U.S. Application Data

(60) Provisional application No. 61/585,667, filed on Jan. 12, 2012.

(51) Int. Cl.
  *G01R 31/02* (2006.01)
  *G01R 31/08* (2006.01)
  *G01R 31/04* (2006.01)
  *B60W 10/26* (2006.01)
  *B60W 20/00* (2016.01)

(52) U.S. Cl.
  CPC ............ *B60W 20/50* (2013.01); *G01R 31/021* (2013.01); *G01R 31/026* (2013.01); *G01R 31/04* (2013.01); *G01R 31/08* (2013.01)

(58) Field of Classification Search
  USPC .................................. 307/9.1, 10.1; 324/503
  See application file for complete search history.

(56) References Cited

U.S. PATENT DOCUMENTS

| | | | |
|---|---|---|---|
| 6,049,139 A | 4/2000 | Nagaura et al. |
| 6,194,877 B1 | 2/2001 | Judge et al. |
| 6,462,550 B2 | 10/2002 | Yudahira |
| 6,828,798 B2 | 12/2004 | Morimoto |
| 7,242,196 B2 | 7/2007 | Yudahira et al. |
| 7,427,865 B2 | 9/2008 | Elder et al. |
| 7,508,097 B2 | 3/2009 | Furuta et al. |
| 7,586,722 B2 | 9/2009 | Scholer et al. |
| 7,589,492 B2 | 9/2009 | Ooishi et al. |
| 7,649,360 B2 | 1/2010 | Ivan et al. |
| 7,688,024 B2 | 3/2010 | Kamaga |
| 7,746,023 B2 | 6/2010 | Ajima et al. |
| 7,768,220 B2 | 8/2010 | Schulz et al. |
| 7,886,857 B2 | 2/2011 | Fujitake |
| 2001/0019269 A1 | 9/2001 | Yudahira |
| 2002/0117939 A1* | 8/2002 | Kawamoto ......... F02D 41/2096 310/316.03 |
| 2005/0253458 A1* | 11/2005 | Omae ..................... H01M 6/36 307/10.1 |
| 2005/0266740 A1 | 12/2005 | Kikuchi et al. |
| 2008/0011528 A1 | 1/2008 | Verbrugge et al. |
| 2009/0228163 A1 | 9/2009 | Tarchinski |
| 2010/0079105 A1 | 4/2010 | Iwanaga et al. |
| 2010/0271052 A1* | 10/2010 | Ishikawa .............. G01R 31/026 324/686 |

FOREIGN PATENT DOCUMENTS

| | | |
|---|---|---|
| JP | 2001-352690 A | 12/2001 |
| JP | 2008-278564 A | 11/2008 |
| JP | 2011-101590 | 5/2011 |
| KR | 10-0857987 B1 | 9/2008 |
| KR | 10-0867834 B1 | 11/2008 |
| KR | 10-2009-0057138 | 6/2009 |
| KR | 10-0962855 B1 | 6/2010 |
| WO | WO 2005/036297 A1 | 4/2005 |

OTHER PUBLICATIONS

International Search Report and Written Opinion issued in PCT/US2013/026321, Jun. 3, 2013.

\* cited by examiner

SYSTEM AND METHOD FOR HIGH VOLTAGE CABLE DETECTION IN HYBRID VEHICLES

CROSS REFERENCE TO RELATED APPLICATIONS

This application is a continuation of International Application No. PCT/US2013/021111 filed Jan. 11, 2013, which claims the benefit of U.S. Provisional Patent Application No. 61/585,667 filed Jan. 12, 2012, the entire disclosures of which are hereby incorporated by reference.

BACKGROUND

The present disclosure generally relates to electrical safety and control systems in electric and hybrid electric vehicles. More specifically, the present disclosure relates to a system and method for detecting high voltage cable connections in vehicles having high voltage energy storage systems.

Modern electric or hybrid electric vehicles containing a high voltage battery or energy storage system (ESS) which provides a portion of the energy required to propel the vehicle will typically contain high voltage cables or bus lines for transferring power from the ESS to various vehicle components. Such components may include, for example, an inverter, motor generator, power converter, etc. The cables may also be used to connect individual energy storage modules within the ESS itself.

The integrity of the high voltage cable connections is of utmost importance to the operation of the vehicle. Any fault, short, or open circuit in the cabling can lead to insufficient power being applied the electric drive components, resulting in poor vehicle performance, loss of mobility, or increased component wear or failure. Problems in the high voltage cabling may also create a severe safety risk for the occupants of the vehicle or technicians attempting to service the vehicle. For example, a cable which is connected to a high voltage source at one end, but disconnected at the other end, may make unintended contact with surrounding vehicle components or surfaces, creating a potential fire or shock hazard.

SUMMARY

According to one aspect of the present disclosure, a method for automatically detecting the presence of a disconnected high voltage cable condition in a hybrid electric vehicle is presented, comprising operating a DC-DC converter in a boost mode to supply a test voltage on a converter cable connected between the DC-DC converter and a high voltage energy storage system, said test voltage being less than 50 volts and greater than 14 volts; and using a controller connected to the energy storage system, automatically comparing a first voltage measured at a first terminal of the energy storage system with the test voltage to determine whether the converter cable is properly connected between the DC-DC converter and the energy storage system. A battery supply power at a voltage lower than said test voltage to a low side of the DC-DC converter when the DC-DC converter is operating in boost mode. The method may further comprise a second voltage measured at a second terminal of an inverter with the test voltage to determine whether an inverter cable is properly connected between the energy storage system and the inverter. The method may further comprises using the controller to automatically compare a third voltage measured at a third terminal of a first energy storage module within the energy storage system to determine whether a module link cable is properly connected between the first energy storage module and a second energy storage module within the energy storage system. The controller may perform the voltage comparison in response to a request to initiate a vehicle start-up sequence. The controller may further prevent progress in the vehicle start-up sequence if at least one of the converter, inverter, and module link cables is not determined to be properly connected. The method may further comprise preventing the energy storage system from supplying high voltage power to at least one of the DC-DC converter and the inverter by maintaining a high-voltage contact switch of the energy storage system in an open position if at least one of the DC-DC converter, inverter, and module link cables is not properly connected.

According to another aspect, a method for automatically detecting the presence of a disconnected high voltage cable condition in a hybrid electric vehicle is presented, comprising operating a DC-DC converter in a boost mode to supply a test voltage on a first high voltage cable connected between a high voltage energy storage system and a high voltage component of the hybrid electric vehicle, said test voltage being less than 50 volts and greater than 14 volts; and, using a controller connected to the high voltage component, automatically comparing a first voltage measured at a first terminal of the high voltage component with the test voltage to determine whether the first high voltage cable is properly connected between the high voltage energy storage system and the inverter. The method may further comprise operating the DC-DC converter in a buck mode to convert high voltage power from the energy storage system to low-voltage power for supplying a low voltage subsystem of the hybrid electric vehicle.

According to another aspect, a system for detecting high voltage cable connections in a hybrid electric vehicle, comprising an energy storage system for supplying high voltage power to a drivetrain of the vehicle; a DC-DC converter adapted to convert said high voltage power supplied by said energy storage system to a lower supply voltage for use by at least one low voltage subsystem of the hybrid electric vehicle; a high voltage converter cable connecting the energy storage system and a high side of the DC-DC converter; and a controller operatively connected to the energy storage system for controlling the flow of power being output by the energy storage system to the high voltage converter cable. The DC-DC converter is also capable of operating in a boost mode for supplying a test voltage to the high voltage converter cable, said test voltage being greater than said lower supply voltage and less than fifty volts. The controller compares a first voltage measured at a first terminal of the energy storage system with the test voltage to determine whether the high voltage converter cable is properly connected between the DC-DC converter and the energy storage system. The system may further comprise a low voltage battery operatively connected to a low side of the DC-DC converter, the low voltage battery configured to supply low voltage power at said lower supply voltage as input to the DC-DC converter when the DC-DC converter is operating in boost mode. The system may further comprise an inverter adapted to provide AC power to an E-machine within the hybrid electric vehicle drivetrain; and a high voltage inverter cable connecting the energy storage system and the inverter; wherein the controller compares a second voltage measured at a second terminal of the inverter with the test voltage to determine whether the high voltage inverter cable is properly connected between the energy storage system and the inverter. The energy storage system may further comprise a plurality of energy storage modules, a first one and a second one of the energy storage modules connected together by a high voltage module link cable, said first one of said energy storage modules also connected to said converter cable. The controller may compare a third voltage measured at a third terminal of the second energy storage module to determine whether the high voltage module link cable is properly connected between the first energy storage module and the second energy storage module. The controller may perform the comparison in response to a request to initiate a vehicle start-up sequence. The controller may prevent further progress in the vehicle startup sequence if at least one of the high voltage converter, inverter and module link cables is not determined to be properly connected. The energy storage system may comprise at least one high voltage contact switch for electrically isolating the energy storage system from at least one of the DC-DC converter and the inverter. The controller may maintain the high voltage contact switch in an open position if at least one of the the high voltage converter, inverter and module link cables is not properly connected.

According to another aspect, a system for detecting high voltage cable connections in a hybrid electric vehicle is presented, comprising an energy storage system for supplying high voltage power to a first high voltage component of the hybrid electric vehicle; a DC-DC converter adapted to convert the high voltage power output by said energy storage system to a lower supply voltage for use by at least one low voltage subsystem of the hybrid electric vehicle; a first high voltage cable connecting the energy storage system and the first high voltage component; and a controller operatively connected to the energy storage system for controlling the flow of power being output by the energy storage system to the first high voltage cable; wherein the DC-DC converter is also capable of operating in a boost mode for supplying a test voltage to the first high voltage cable, said test voltage being greater than said lower supply voltage and less than fifty volts; and wherein the controller compares a first voltage measured at a first terminal of the first high voltage component with the test voltage to determine whether the first high voltage cable is properly connected between the energy storage system and the first high voltage component.

Further forms, objects, features, aspects, benefits, advantages, and embodiments of the present invention will become apparent from a detailed description and drawings provided herewith.

DETAILED DESCRIPTION

Figure 1:
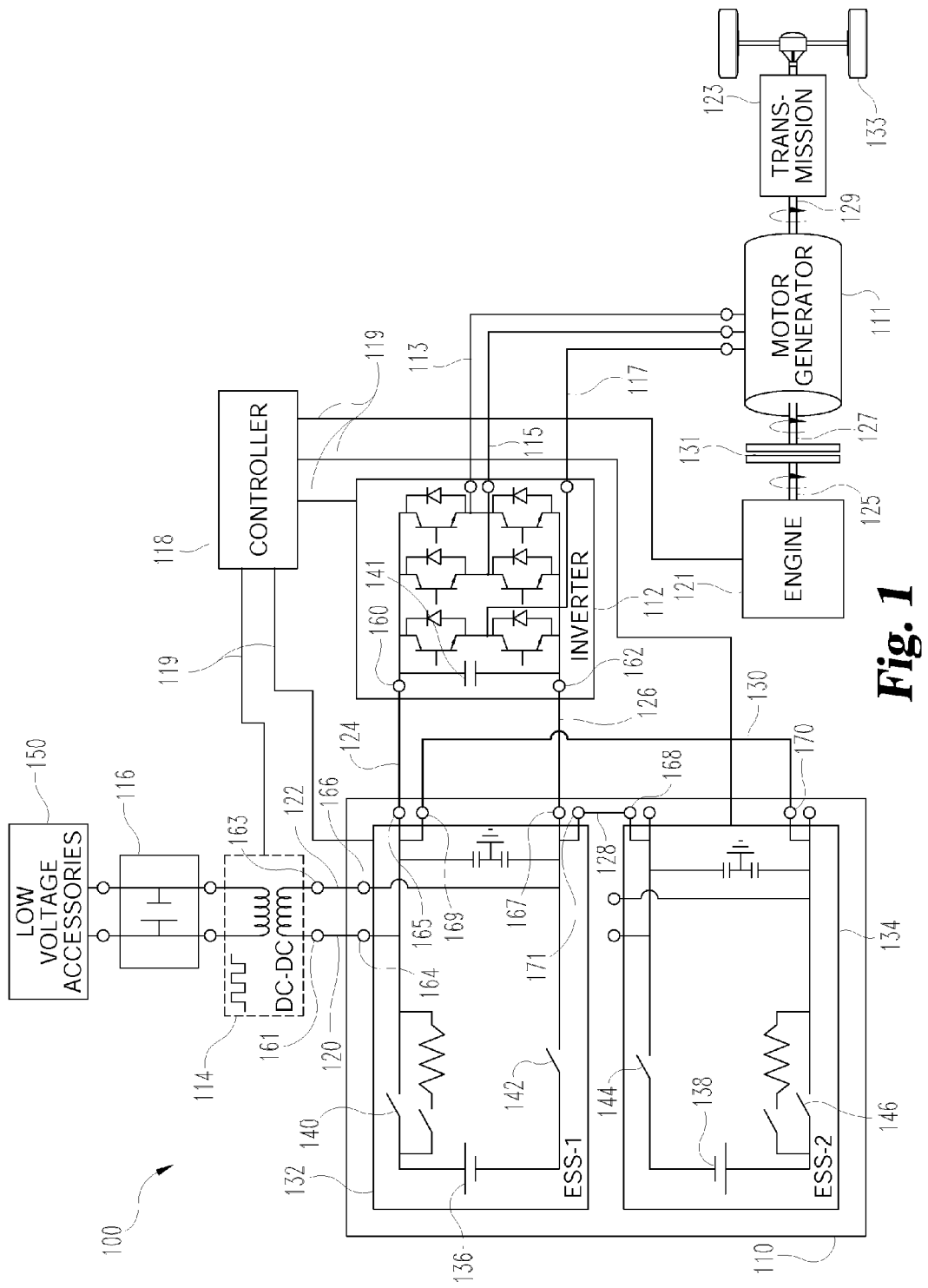
FIG. 1 is a schematic diagram of a system for detecting high voltage cables in a hybrid vehicle according to one embodiment of the present disclosure.

For the purpose of promoting an understanding of the principles of the invention, reference will now be made to the embodiments illustrated in the drawings, and specific language will be used to describe the same. It will nevertheless be understood that no limitation of the scope of the invention is thereby intended. Any alterations and further modifications in the described embodiments and any further applications of the principles of the invention as described herein are contemplated as would normally occur to one skilled in the art to which the invention relates. One embodiment of the invention is shown in great detail, although it will be apparent to those skilled in the relevant art that some features not relevant to the present invention may not be shown for the sake of clarity.

For the convenience of the reader, it should be initially noted that a drawing in which an element is first introduced is typically indicated by the left-most digit(s) in the corresponding reference number. For example, a component identified with a one-hundred series reference number (e.g., 100, 101, 102, 103, etc.) will usually be first discussed with reference to FIG. 1, and a component identified with a two-hundred series reference number (e.g., 200, 201, 202, 203, etc.) will usually be first discussed with reference to FIG. 2.

In previous systems, the voltage at the main ESS contactors is measured to detect a welded contact condition prior to closing the contactors for normal operation. However, this technique fails to detect disconnected cables between the ESS contactors and the other vehicle components. The technique illustrated by the present disclosure solves this issue by running a DC-DC converter in a boost mode to provide a safe, yet effective, test voltage for measuring the voltage at various points in the cabling to detect when a cable has become disconnected.

FIG. 1 shows a diagrammatic view of a vehicle hybrid drive control system 100 according to one embodiment of the present disclosure. The system and control methods described herein are applicable to any type of electric or hybrid vehicle drive which incorporates a high voltage energy storage system (e.g., a battery) for supplying a portion of the power required to propel the vehicle. As shown, the system 100 includes an energy storage system (ESS) 110, an inverter 112, DC-DC converter 114, low voltage battery 116, and controller 118. High voltage converter cables 120 (positive) and 122 (negative) connect terminals 164 and 166 of the ESS 110 to terminals 161 and 163 of the DC-DC converter 114. High voltage inverter cables 124 (positive) and 126 (negative) connect terminals 165 and 167 of the ESS 110 to terminals 160 and 162 of the inverter 112. High voltage ESS module link cables 128 (negative) and 130 (positive) connect terminals 169 and 171 of the energy storage module 132 to terminals 168 and 170 of the energy storage module 134 within the ESS 110. In the embodiment of FIG. 1, terminals 164, 165 and 169 are electrically connected to each other within the ESS 110. Likewise, terminals 166, 167 and 171 are electrically connected to each other within the ESS 110.

It shall be understood that additional high voltage cables may be used to connect the ESS 110 to other high voltage vehicle components present in the vehicle or to connect additional high voltage components to each other. For example, the inverter 112 may be used to supply AC power to an E-machine 111 (e.g., a motor generator) via high voltage cables 113, 115 and 117. The E-machine 111 may be connected to the vehicle transmission 123 via rotating shaft 129, with transmission 123 providing suitable torque transfer to wheels 133. In the case of a hybrid electric vehicle, engine 121 may also be mechanically connected to the E-machine 111 and transmission 123 via clutch 131 and rotating shafts 125 and 127 as shown. The engine 121 is able to provide additional propulsion when the ESS is partially or completely discharged or to run the E-machine 111 in a generator mode to recharge the ESS 110.

In general operation, the controller 118 interfaces with the various components in FIG. 1 to control the flow of power being supplied by the ESS 110. When power is requested, such as upon initiation of an ignition key-on event, the controller 118 causes the main ESS contactors 140, 142, 144 and 146 to close, thereby supplying power to the required vehicle components. As will be explained further below, the controller 118 measures the voltage at each of the high voltage components to ensure that the various high voltage power cables are properly connected before allowing the contactors to close. In order to provide an accurate measurement, however, a threshold amount of voltage is required. The system 100 provides this voltage by operating the DC-DC converter 114 in a boost mode to direct power from the low voltage battery 116 to the high voltage cabling (e.g., at terminals 164 and 166). The boost mode function of the DC-DC converter 114 may be accomplished using a continuous or discontinuous switching mode, depending on the needs of the application. The voltage from the low voltage battery 116 (typically 12 volts) is converted to a higher voltage which is suitable for detecting and measuring the connection of the high voltage cables (typically 20 volts), yet is below the threshold required by safety regulations (typically 50 volts). This allows the cable connections to be detected before the main ESS high-voltage contactors (140, 142, 144 and 146) are closed and high voltage is applied to the cabling, which is typically in the range of 400 to 450 volts.

ESS 110 includes multiple energy storage modules 132 and 134 which are connected in parallel to provide sufficient current to the vehicle electrical components during normal operation. Although two energy storage modules are illustrated in FIG. 1, it shall be understood that any number of energy storage modules may be used, and that the energy storage modules may be connected in parallel (as illustrated in FIG. 1), in series, or in a series/parallel arrangement. Moreover, it is envisioned that the energy storage system 110 can include any system for storing potential energy, such as through chemical means, pneumatic accumulators, hydraulic accumulators, springs, thermal storage systems, flywheels, gravitational devices, and capacitors, to name just a few examples. In one embodiment, the energy storage modules 132 and 134 contain batteries 136 and 138, respectively. The batteries 132 and 134 each preferably comprise a plurality of individual battery cells which are connected in series to achieve the required high-voltage for operating the electric drivetrain components. In one embodiment, the batteries 132 and 134 operate at a voltage of approximately 420 volts, however other voltages may be used.

Inverter 112 may comprise a DC-AC inverter which converts DC power from the ESS 110 into AC power for driving other downstream high voltage components, such as E-machine 111. The inverter 112 may also serve to convert alternating current (AC) generated by the E-machine 111 into DC current for charging the batteries 136 and 138 of ESS 110 when the E-machine 111 is operating as a generator being driven by the engine 121 or the residual inertia of the vehicle (e.g., during regenerative braking or other ESS regeneration modes).

DC-DC converter 114 is connected to the ESS 110 by high voltage cables 120 (positive) and 122 (negative). In one embodiment, the DC-DC converter 114 comprises a switched-mode buck-boost converter. When operating as a buck converter (i.e., a step-down converter), the DC-DC converter 114 converts the high voltage DC power being supplied by the ESS 110 to a lower DC voltage. The lower voltage is in turn used to charge the low voltage battery 116 and supply DC power to vehicle systems and accessories 150 which require a lower voltage, typically in the range of 12 to 24 volts. When operating as a boost converter, the DC-DC converter 114 transforms low voltage power from the battery 116 to a higher voltage for jumpstarting the vehicle (e.g., if the ESS 110 has become discharged) or detecting the high voltage cable connections, as will be described further below. It shall be understood that in addition to a buck-boost converter, DC-DC converter 114 may comprise other types of combination step-up and step-down DC-DC converters.

In a typical embodiment, controller 118 may include a computer having a processor, memory, and input/output connections. It shall be understood that additional elements may be included in the controller 118 as required by the particular application. It shall be further understood that the controller 118 may comprise separate controller modules at each of the high voltage components, a single controller in a common housing, or any combination thereof. The controller 118 may receive additional signals, such as voltage, current, phase, heat, position, speed and/or other variables for the efficient control of the system 100. More specifically, the controller 118 may receive voltage signals which are measured at the high voltage terminals 160 and 162 of inverter 112, terminals 164 and 166 of ESS 110, and terminals 168 and 170 of energy storage module 134 in ESS 110. The controller 118 may also receive signals from other vehicle control subsystems, including vehicle start/stop commands, power and torque change requests, and the like.

It shall be understood that each of the high voltage components 110, 112, and 114 may also contain additional measurement or control circuitry for measuring or transmitting voltages and other related measurement signals to the controller 118. The controller 118 may receive the measured voltages over control lines 119. Each of the control lines 119 may comprise a direct input conductor or conductor pair carrying the actual voltage being measured or a data format medium which uses a communication protocol or data bus to transmit the voltage measurement value from the relevant high voltage component to the controller 118. Still other arrangements or circuitry known in the art may be used to transmit the measured voltages to the controller 118.

Figure 2:
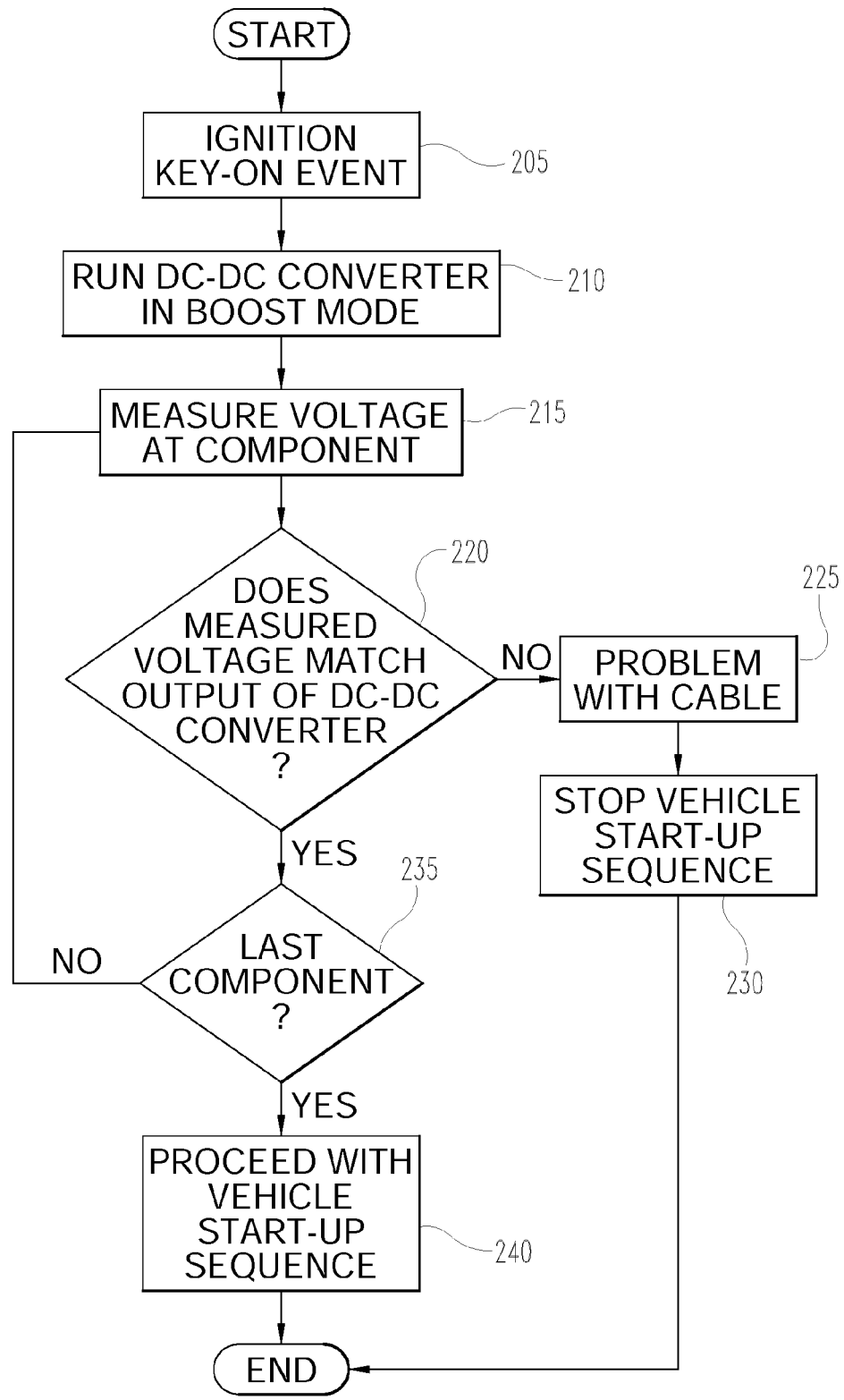
FIG. 2 is a diagram which illustrates the stages involved in detecting high voltage cables in a hybrid vehicle using the system of FIG. 1 according to one embodiment.

FIG. 2 illustrates a process for detecting the connection of high voltage cables in the system 100. The process starts at step 205 when the controller 118 receives an ignition key-on event. After the ignition key-on event is received, but before initiating the standard vehicle start-up sequence, the controller 118 directs the DC-DC converter to temporarily run in a boost mode to generate a voltage in the range of 15 to 50 volts at the terminals 164 and 166. The cited range provides sufficient voltage to allow an accurate measurement, yet is below the threshold typically required for safety regulations to prevent injury to operators or service personnel. In a preferred embodiment, a minimum voltage of 20 volts is used in order to achieve increased measurement accuracy.

Once a sufficient period of time has passed to allow the desired voltage to be achieved by the DC-DC converter 114 (typically less than 100 milliseconds), the process proceeds to step 215 where the controller 118 evaluates a voltage signal measured across the terminals 164 and 166 of energy storage module 132 within ESS 110. The voltage signal may be measured by appropriate measurement circuitry within the ESS 110 and transmitted to the controller 118 via control lines 119. If the measured signal matches the voltage being output by the DC-DC converter (decision block 220), accounting for typical cable voltage drop, then the cables 120 and 122 are assumed to be properly connected. If the measured voltage is too low (below a predetermined threshold), the controller assumes that the cable has become disconnected or its integrity has otherwise been compromised (step 225). The vehicle start-up sequence is then stopped (step 230) until appropriate corrective measures can be taken.

If the voltage measured at step 220 is determined to be sufficient, the process moves to decision block 235 to determine whether additional high voltage component cables should be evaluated. With respect to the illustrated system 100, the process returns to step 215 and measures the voltage across terminals 160 and 162 of the inverter 112. Again, the voltage signal may be measured by appropriate measurement circuitry within the inverter 112 and transmitted to the controller 118 via control lines 119. If the voltage matches the voltage being output by the DC-DC converter 114 in boost mode, the controller 118 determines that the high voltage cables 124 and 126 are properly connected. If the voltage is too low, the controller 118 again assumes that at least one of the cable connections has been compromised and the process proceeds to step 225 and 230 where the vehicle start-up sequence is stopped.

The process repeats steps 215 and 220 once more by measuring the voltage across terminals 168 and 170 at the energy storage module 134 to detect the connection status of high-voltage module link cables 128 and 130. It shall be understood that additional high voltage cables may be evaluated or detected in a similar fashion, with the controller progressively evaluating the cable connections further downstream of the previously evaluated cable section. If the previously evaluated upstream termination voltage is determined to be adequate, but the voltage at the terminals being currently evaluated is below a predetermined threshold, it can be assumed that there is a problem with the cable section from the previously measured termination point to the currently measured termination point.

It shall be understood that instead of stopping the vehicle start-up sequence at step 230, the start-up sequence may be allowed to continue, depending on the measured voltage or other considerations regarding the cable being detected. For example, if the cable being evaluated is determined to be only partially disconnected or compromised due to minor corrosion (e.g., the detected voltage is only partially reduced when compared to the test voltage), the controller 118 may simply alert the driver that the condition should be addressed at the next service appointment, while still allowing the vehicle to be driven.

If all of the high voltage cable connections have been verified (decision block 235), the controller allows the contacts 140, 142, 144 and 146 of the ESS to close and the vehicle start-up sequence proceeds at step 240.

It shall be understood that while the process of FIG. 2 is described in relation to an ignition key-on event within a vehicle start-up sequence, the process may also be triggered by other vehicle events. For example, the cable test process may be performed any time the contacts 140, 142, 144 and 146 are about to be closed, to ensure that high voltage from the batteries 136, 138 is only supplied to the intended vehicle component if the cabling is connected and functioning properly.

As used in the specification and claims, the words "cable" and "cabling" shall be interpreted to mean any electrical conductor which connects to and provides a conductive path between two electrical components, such as insulated wire conductors, multi-conductor jacketed cabling, electrical bus bars, and the like. Furthermore, it shall be understood that the particular arrangement of high voltage cables shown in FIG. 1 is meant for illustrative purposes only, and additional arrangements and combinations of high voltage cabling and components are contemplated to be within the scope of the present disclosure. For example, while the high voltage cabling is shown in FIG. 1 as having dedicated ground conductors (122, 126, and 128) for each positive conductor (120, 124 and 130, respectively), the system 100 may also utilize a common ground arrangement, with the ground conductors tied to a common ground point, such as a main chassis ground.

As used in the specification and claims, the words "low voltage" shall be interpreted to mean voltages equal to or less than fifty volts.

As used in the specification and claims, the words "high voltage" shall be interpreted to mean voltages greater than fifty volts.

While the invention has been illustrated and described in detail in the drawings and foregoing description, the same is to be considered as illustrative and not restrictive in character, it being understood that only the preferred embodiment has been shown and described and that all changes, equivalents, and modifications that come within the spirit of the inventions defined by following claims are desired to be protected. All publications, patents, and patent applications cited in this specification are herein incorporated by reference as if each individual publication, patent, or patent application were specifically and individually indicated to be incorporated by reference and set forth in its entirety herein.

The invention claimed is:

1. A method for automatically detecting the presence of a disconnected high voltage cable condition in a hybrid electric vehicle, comprising:
   using a controller, operating a DC-DC converter in a boost mode to supply a test voltage on a converter cable connected between the DC-DC converter and a high voltage energy storage system, said test voltage being less than 50 volts and greater than 14 volts; and
   using the controller, automatically comparing an energy storage system voltage measured at an energy storage system terminal of the energy storage system with the test voltage to determine whether the converter cable is properly connected between the DC-DC converter and the energy storage system.

2. The method according to claim 1,
   wherein a battery supplies power at a voltage lower than said test voltage to a low side of the DC-DC converter when the DC-DC converter is operating in boost mode.

3. The method according to claim 1, further comprising:
   using the controller, automatically comparing an inverter voltage measured at an inverter terminal of an inverter with the test voltage to determine whether an inverter cable is properly connected between the energy storage system and the inverter.

4. The method according to claim 1, further comprising:
   using the controller, automatically comparing a first module voltage measured at a first module terminal of a first energy storage module within the energy storage system to determine whether a module link cable is properly connected between the first energy storage module and a second energy storage module within the energy storage system.

5. The method according to claim 1,
   wherein said comparing is performed by the controller in response to a request to initiate a vehicle start-up sequence.

6. The method according to claim 1,
wherein the controller causes the vehicle to be immobilized if at least one of the converter cable, an inverter cable, and a module link cable is not determined to be properly connected.

7. The method according claim 1, further comprising:
preventing the energy storage system from supplying high voltage power to at least one of the DC-DC converter and an inverter of the hybrid vehicle by maintaining a high-voltage contact switch of the energy storage system in an open position if at least one of the DC-DC converter and inverter is not properly connected.

8. A method for automatically detecting the presence of a disconnected high voltage cable condition in a hybrid electric vehicle, comprising:
operating a DC-DC converter in a boost mode to supply a test voltage on a first high voltage cable connected between a first high voltage component and a second high voltage component of the hybrid electric vehicle, said test voltage being less than 50 volts and greater than 14 volts; and
comparing a component voltage measured at a terminal of at least one of the first and second high voltage components with the test voltage to determine whether the first high voltage cable is properly connected between the first and second high voltage components.

9. The method of claim 8, further comprising:
operating the DC-DC converter in a buck mode to convert high voltage power from an energy storage system of the hybrid vehicle to low-voltage power for supplying a low voltage subsystem of the hybrid electric vehicle.

10. A system for detecting high voltage cable connections in a hybrid electric vehicle, comprising:
an energy storage system for supplying high voltage power to a drivetrain of the vehicle;
a DC-DC converter adapted to convert said high voltage power supplied by said energy storage system to a lower supply voltage for use by at least one low voltage subsystem of the hybrid electric vehicle;
a high voltage converter cable connecting the energy storage system and a high side of the DC-DC converter; and
a controller operatively connected to the energy storage system for controlling the flow of power being output by the energy storage system to the high voltage converter cable;
wherein the DC-DC converter is also capable of operating in a boost mode for supplying a test voltage to the high voltage converter cable, said test voltage being greater than said lower supply voltage and less than fifty volts; and
wherein the controller automatically compares an energy storage system voltage measured at a energy storage system terminal of the energy storage system with the test voltage to determine whether the high voltage converter cable is properly connected between the DC-DC converter and the energy storage system.

11. The system according to claim 10, wherein said lower supply voltage is between 12 and 24 volts.

12. The system according to claim 10, further comprising:
a low voltage battery operatively connected to a low side of the DC-DC converter, said low voltage battery configured to supply low voltage power at said lower supply voltage as input to the DC-DC converter when the DC-DC converter is operating in boost mode.

13. The system according to claim 10, further comprising:
an inverter adapted to provide AC power to an E-machine within the hybrid electric vehicle drivetrain; and
a high voltage inverter cable connecting the energy storage system and the inverter;
wherein the controller compares an inverter voltage measured at an inverter terminal of the inverter with the test voltage to determine whether the high voltage inverter cable is properly connected between the energy storage system and the inverter.

14. The system according to claim 10,
wherein the energy storage system comprises a plurality of energy storage modules, a first one and a second one of the energy storage modules connected together by a high voltage module link cable, said first one of said energy storage modules also connected to said converter cable; and
wherein the controller compares a module voltage measured at a module terminal of the second energy storage module to determine whether the high voltage module link cable is properly connected between the first energy storage module and the second energy storage module.

15. The system according to claim 10,
wherein said comparing is performed by the controller in response to a request to initiate a vehicle start-up sequence.

16. The system according to claim 10,
wherein the controller causes the vehicle to be immobilized if at least one of the high voltage converter cable, an inverter cable, and a module link cable is not determined to be properly connected.

17. The system according to claim 10,
wherein the energy storage system comprises at least one high voltage contact switch for electrically isolating the energy storage system from at least one of the DC-DC converter and the inverter.

18. The system according to claim 10,
wherein the controller maintains the high voltage contact switch in an open position if at least one of the the high voltage converter cable, an inverter cable and a module link cable is not properly connected.

19. A system for detecting high voltage cable connections in a hybrid electric vehicle, comprising:
an energy storage system for supplying high voltage power to a first high voltage component of the hybrid electric vehicle;
a DC-DC converter adapted to convert the high voltage power output by said energy storage system to a lower supply voltage for use by at least one low voltage subsystem of the hybrid electric vehicle;
a first high voltage cable connecting the energy storage system and the first high voltage vehicle component; and
a controller operatively connected to the hybrid vehicle for controlling the flow of power being output by the energy storage system to the first high voltage cable;
wherein the DC-DC converter is also capable of operating in a boost mode for supplying a test voltage to the first high voltage cable, said test voltage being greater than said lower supply voltage and less than fifty volts; and
wherein the controller compares a component voltage measured at a first terminal of the first high voltage component with the test voltage to determine whether the first high voltage cable is properly connected between the energy storage system and the first high voltage component.

20. The system according to claim 19,
wherein the first high voltage component comprises an inverter.

* * * * *